United States Patent [19]

Maa

[11] Patent Number: 5,878,057
[45] Date of Patent: *Mar. 2, 1999

[54] HIGHLY PARALLEL CYCLIC REDUNDANCY CODE GENERATOR

[75] Inventor: Chia-Yiu Maa, Beaverton, Oreg.

[73] Assignee: Tektronix, Inc., Wilsonville, Oreg.

[*] Notice: This patent issued on a continued prosecution application filed under 37 CFR 1.53(d), and is subject to the twenty year patent term provisions of 35 U.S.C. 154(a)(2).

[21] Appl. No.: 540,145

[22] Filed: Oct. 6, 1995

[51] Int. Cl.$^6$ .................................................. H03M 13/00
[52] U.S. Cl. ........................................ 371/37.6; 371/37.7
[58] Field of Search ................................ 371/37.01, 37.2, 371/37.3, 37.4, 37.5, 37.6, 37.7, 37.8, 53

[56] References Cited

U.S. PATENT DOCUMENTS

| | | | |
|---|---|---|---|
| 4,700,350 | 10/1987 | Douglas et al. | 371/37.1 |
| 4,723,243 | 2/1988 | Joshi et al. | 371/37.1 |
| 4,937,828 | 6/1990 | Shih et al. | 371/37.1 |
| 5,103,451 | 4/1992 | Fossey | 371/37.6 |
| 5,121,396 | 6/1992 | Irvin et al. | 371/53 |
| 5,130,991 | 7/1992 | Takano | 371/37.6 |
| 5,132,975 | 7/1992 | Avaneas | 371/37.6 |
| 5,282,214 | 1/1994 | Dravida | 371/37.6 |
| 5,325,372 | 6/1994 | Ish-Shalom | 371/37.6 |
| 5,383,204 | 1/1995 | Gibbs et al. | 371/37.7 |
| 5,523,707 | 6/1996 | Levy et al. | 362/52 |
| 5,619,516 | 4/1997 | Li et al. | 371/53 |

OTHER PUBLICATIONS

"A Tutorial on CRC Computations" Tenkasi V. Ramabadran & Sunil S. Gaitonde Iowa State University, IEEE MICRO, 1988 IEEE.

"Preserving the Integrity of Cyclic–redundancy Check When Protected Text is Intentionally Altered" by D.R. Irvin, IBM J. Res. Develop. vol 33 No. 6 Nov. 1989.

"Parallel CRC Generation", Guido Albertengo & Riccardo Sisto, 1990 IEEE.

"High–Speed Parallel CRC Circuits in VLSI", Tong–Bi Pei & Charles Zukowski Transactions Letters, IEEE Transactions on Communications, vol 40, No. 4 Apr. 1992.

"A Method for Updating a Cyclic Redundancy Code", Michael Gutman Transactions Letters, IEEE Transactions on Communications, vol 40, No. 6 Jun. 1992.

Primary Examiner—Emmanuel L. Moise
Attorney, Agent, or Firm—Francis I. Gray

[57] ABSTRACT

A highly parallel cyclic redundancy code generator has p precalculated k-bit remainder polynomials loaded in a lookup table. A cyclic redundancy code register has a p-bit portion and a k-bit portion. An input data message is input to an input XOR gate together with the contents of the p-bit portion to generate a p-bit result for storage in the p-bit portion. The content of the p-bit portion is used to control which k-bit remainder polynomials from the lookup table are to be parallel XOR'd to produce a partial cyclic redundancy code that is stored in the k-bit portion. The contents of the CRC register are shifted to the left and the process repeated until all of the bits of the input data message have been processed. The contents of the k-bit portion are then output as the CRC for the input data message.

5 Claims, 2 Drawing Sheets

HIGHLY PARALLEL CYCLIC REDUNDANCY CODE GENERATOR

BACKGROUND OF THE INVENTION

The present invention relates to checking the integrity of digital data, and more particularly to a highly parallel cyclic redundancy code (CRC) generator that produces partial CRCs in parallel to any degree to greatly impact each and every high-speed digital networking application.

The cyclic redundancy code (CRC) has been used for a long time as a means to preserve the integrity of digital data for storage and transmission. Treating the data, or message, as a binary polynomial $u(x)$, its CRC which corresponds to a particular generator polynomial $g(x)$ may be generated by first raising the message polynomial to a proper power and then taking the remainder $r(x)$ of the message polynomial divided by the generator polynomial. Early CRC implementations made use of the concept of linear feedback shift registers (LFSR) in which polynomial division is processed one bit at a time.

As the technology advanced single-bit CRC generation using LFSRs was not enough to handle high-speed data processing and transmission. Parallel CRC algorithms were then developed to meet this need. Most of these algorithms generate CRCs in software or in firmware, and some have been implemented in special hardware to take advantage of very large scale integrated (VLSI) circuit technology. These parallel CRC algorithms, although improved over single-bit LFSR, are not highly parallel in the sense that they can process at most one or two bytes at a time, limited by the degree of the generator polynomial. Byte-wise CRC generation is insufficient for very high-speed protocol processing in gigabit-per-second ATM/SONET environments. Considering the case where the internal data path of a host processor is 64-bit, it is highly desirable to perform 64-bit CRC generation even though the degree of the generator polynomial may only be 16 or 32. Existing CRC algorithms are cumbersome in this situation.

The key reason that existing CRC algorithms are limited in their degree of parallelism is deeply rooted in the concept of LFSRs. All existing algorithms try to solve the same problem, i.e., how to parallelize the bit-by-bit operation of LFSRs. As a result the degree of parallelism never goes beyond the perceived size of LFSRs.

What is desired is an improved, highly parallel CRC algorithm which can generate partial CRCs in parallel to any degree.

SUMMARY OF THE INVENTION

Accordingly the present invention provides a highly parallel CRC generator that produces partial CRCs in parallel to any degree. Remainders of the form $R_g[x^i]$, $k \leq i \leq k+p-1$, for a $k+p-1$ degree polynomial are precomputed and loaded into a lookup table. A CRC register, having a p-bit portion and a k-bit portion, is initialized to all zeros. A data message signal is input to an exclusive OR gate where it is XOR'd p bits at a time with the p-bit portion of the CRC register. The result is saved back into the p-bit portion of the CRC register. The p-bit portion of the CRC register is used to control which remainders from the lookup table should be XOR'd via a parallel XOR tree. When $p \geq k$, the result of the parallel XOR operation is stored into the k-bit portion of the CRC register. When $p<k$, the result of the parallel XOR operation is XOR'd with the k-bit portion of the CRC register, and the result is saved back to the k-bit portion of the CRC register. The k-bit portion of the CRC register provides the partial CRC outputs. Prior to each input XOR operation the contents of the CRC register are shifted p bits to the left. This process is iterative until the entire data message has been processed, with the k-bit portion being output as the final CRC for the data message.

The objects, advantages and other novel features of the present invention are apparent from the following detailed description when read in conjunction with the appended claims and attached drawing.

DESCRIPTION OF THE PREFERRED EMBODIMENT

Figure 1:
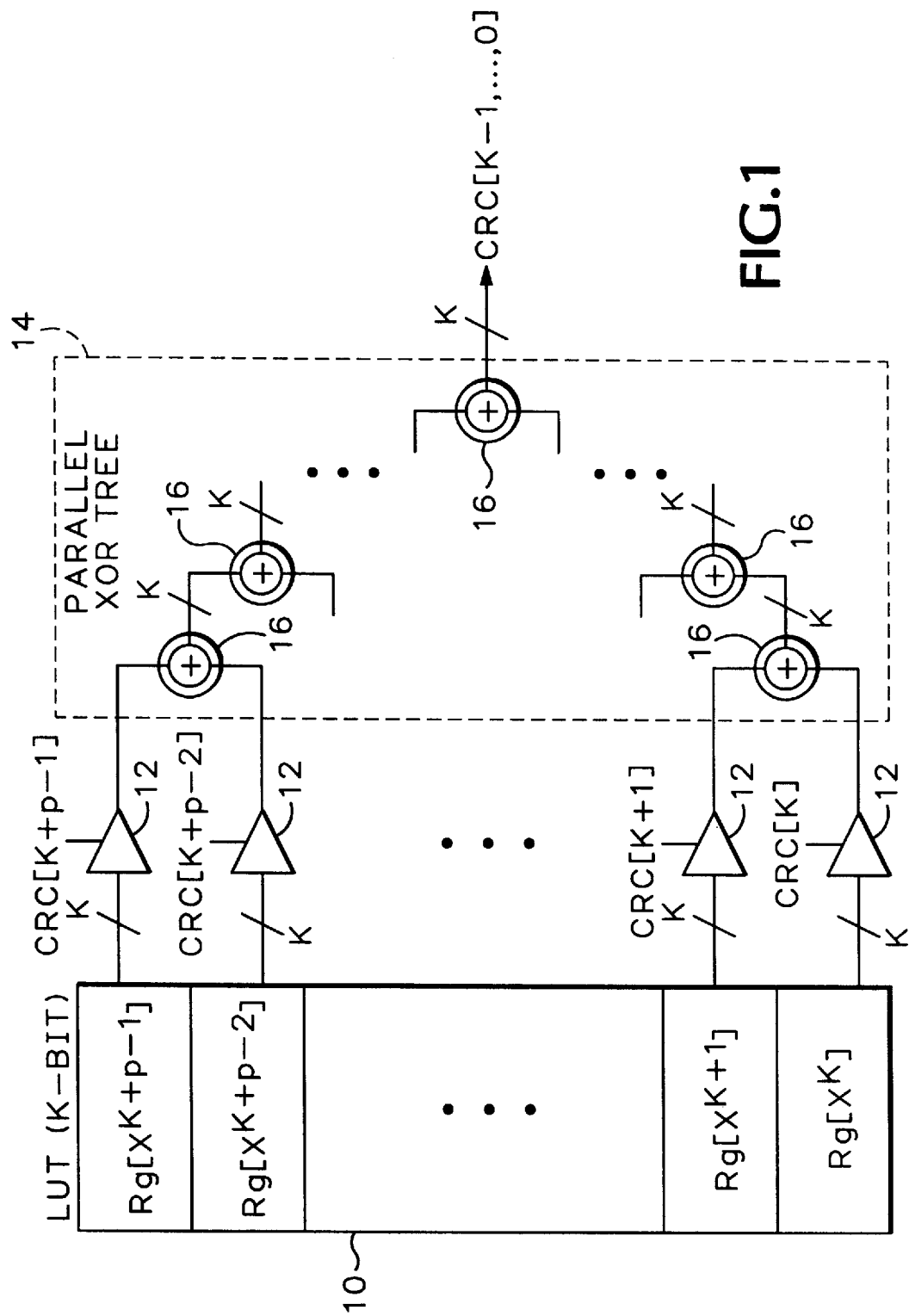
FIG. 1 is a block diagrammatic view of a portion of a highly parallel CRC generator illustrating a parallel XOR tree circuit according to the present invention, assuming $p \geq k$.

Let $u(x)$ be a message polynomial of degree $n-1$, i.e., with n bits; $g(x)$ be a generator polynomial of degree k; p be the number of bits to be processed in parallel, usually greater than k; and $R_g[a(x)]$ be the remainder of $a(x)$ divided by $g(x)$. From these definitions $R_g[a(x)]$ is a polynomial of degree $k-1$. The process of generating CRCs for $u(x)$ is to find the polynomial $r(x)$ of degree $k-1$ such that:

$$R_g[x^k u(x)] = r(x).$$

There is a unique quotient polynomial $q(x)$ satisfying the following equality:

$$x^k u(x) = q(x)g(x) + r(x)$$

For binary polynomials the following are true:
 i) $R_g[x^p + x^q] = R_g[x^p] + R_g[x^q]$;
 ii) $R_g[x^{p+q}] = R_g[x^p R_g[x^q]]$.
The addition of binary polynomials is performed in the sense of modulo-2. By definition:

$$x^k u(x) = x^k (x^{n-1} u_{n-1} + x_{n-2} u_{n-2} + \ldots + x^1 u_1 + x^0 u_0)$$

Define $l = [n/p]$, i.e., the largest integer smaller than or equal to n/p, and rearrange $x^k u(x)$ to be:

$$x^k u(x) = x^k (x^{n-1-p} u_{(1)}(x) + x^{n-1-2p} u_{(2)}(x) + \ldots + x^{n-1-(l-1)p} u_{(l-1)}(x) + u_{(0)}(x))$$

where $u_{(1)}(x)$ is a (p−1)-degree polynomial containing the first p coefficients of $u(x)$, $u_{(2)}(x)$ is a (p−1)-degree polynomial containing the next p coefficients of $u(x)$, etc., and $u_{(0)}(x)$ contains the remaining terms of $u(x)$ from $x^{n-1-(l-1)p-1}$ to $x^0$.

Using the two facts of binary polynomials:

$$\begin{aligned} R_g[x^k u(x)] &= R_g[x^k R_g[u(x)]] \\ &= R_g[x^k (R_g[x^{n-1-p} u_{(1)}(x)] + R_g[x^{n-1-2p} u_{(2)}(x)] + \ldots + \\ &\quad R_g[x^{n-1-(l-1)p} u_{(l-1)}(x)] + R_g[u_{(0)}(x)])] \end{aligned}$$

or equivalently in an iterative form:

$$= R_g[x^k R_g[\underbrace{x^{n-1-(l-1)p} R_g[\underbrace{x^p R_g[\ldots R_g[\underbrace{x^p R_g[\underbrace{x^p R_g[\underbrace{u_{(l)}(x)}_{l}]}_{1}}_{2}}_{3} \ldots}_{l-2}}_{l+1} ]+$$

$$\underbrace{u_{(2)}(x)}_{2}] + \underbrace{u_{(3)}(x)}_{3}] + \ldots] + \underbrace{u_{(l-1)}(x)}_{l-1}] + \underbrace{u_{(0)}(x)}_{l\ l+1}]]$$

The indices under the brackets are used to identify bracket pairs. By moving the term $x^k$ inside the equation becomes:

$$= R_g[\underbrace{x^{n-1-(l-1)p} R_g[\underbrace{x^p (R_g[\ldots R_g[\underbrace{x^p R_g[\underbrace{x^p R_g[\underbrace{x^k u_{(l)}(x)}_{1}]}_{1}}_{2}}_{3} \ldots}_{l-2}}_{l-1}}_{l} ]+$$

$$\underbrace{x^k u_{(2)}(x)}_{2}] + \underbrace{x^k u_{(3)}(x)}_{3}] + \ldots] + \underbrace{x^k u_{(l-1)}(x)}_{l-2}] + \underbrace{x^k u_{(0)}(x)}_{l-1\ \ l}]$$

This equation provides a method of computing the CRC of u(x) in an iterative fashion. Starting from the innermost calculation at every iteration only the computation of the remainder of the sum of, first, the remainder from the last iteration multiplied by $x^p$, and, second, a polynomial $x^k u_{(i)}(x)$ of degree k+p−1 is needed. The term $x^{n-1-(l-1)p}$ raises the partial CRC to a proper power before summing with $x^k u_{(0)}(x)$ for final CRC generation.

The parallel generation of the remainder of a polynomial of degree k+p−1 is achieved by first pre-calculating the remainders $R_g[x^i]$, $k \leq i \leq k+p-1$, to form a lookup table. Then at every iteration for those $x^i$ terms with nonzero coefficients their $R_g[x^i]$ remainders are XOR'd together to obtain a partial CRC. By writing the expansion of $R_g[x^k u(x)]$ in different iterative forms, various parallel CRC generators may be realized. One possible CRC generation procedure is described below based on the last equation.

/*Initialization*/
1. Pre-compute lookup table entries $R_g[x^i]$, $k \leq i \leq k+p-1$;
2. Initialize a register CRC[k+p−1 . . . 0] to zeros;
/*Main loop*/
3. While (there are more than p bits to be processed) do {
4.    Shift CRC[k−1 . . . 0] p bits to the left;
5.    Input the next p bits from u(x) XOR them with CRC[k+p−1. . .k], and save the result in CRC[k+p−1. . .k];
6.    Look up the table for $R_g[x^i]$, $k \leq i \leq k+p-1$, XOR CRC[k−1 . . . 0] with CRC[i]*$R_g[x^i]$, $k \leq i \leq k+p-1$, and save the result in CRC[k−1 . . . 0];
}
/*Finish up*/
7. Let m be the number of bits yet to be processed, shift CRC[k−1 . . . 0] m bits to the left;
8. XOR the last m bits from u(x) with CRC[k + m−1. . .k] and save the result in CRC[k + m−1...k];
9. Look up the table for $R_g[x^i]$, $k \leq i \leq k+m-1$, k+m−1, XOR CRC[k−1 . . . 0] with CRC[i]*$R_g[x^i]$, $k \leq i \leq k+m-1$, and save the result in CRC[k−1 . . . 0].

In implementing the above procedure in hardware the key XOR operations in steps 6 and 9 are performed by a parallel XOR tree, as shown in FIG. 1. A lookup table 10 has p locations of k-bits each, each location containing a remainder value of $R_g[x^i]$, where $k \leq i \leq k+p-1$. The remainders are output in parallel to a plurality of gates 12 which in turn are controlled by the p most significant bits of a CRC register. The outputs from the gates 12 are combined in a parallel XOR tree circuit 14 that has a plurality of two-bit XOR gates 16 in a tree configuration. The output from the last two-bit XOR gate 16 in the tree is the partial CRC data for the p bits of the message. This procedure does not perform table lookup because each $R_g[x^i]$ is always fetched with respect to the same bit position of the CRC register. This is advantageous for high-speed operation. The storage requirement of the lookup table is only k×p bits, one of the smallest CRC tables in use.

Figure 2:
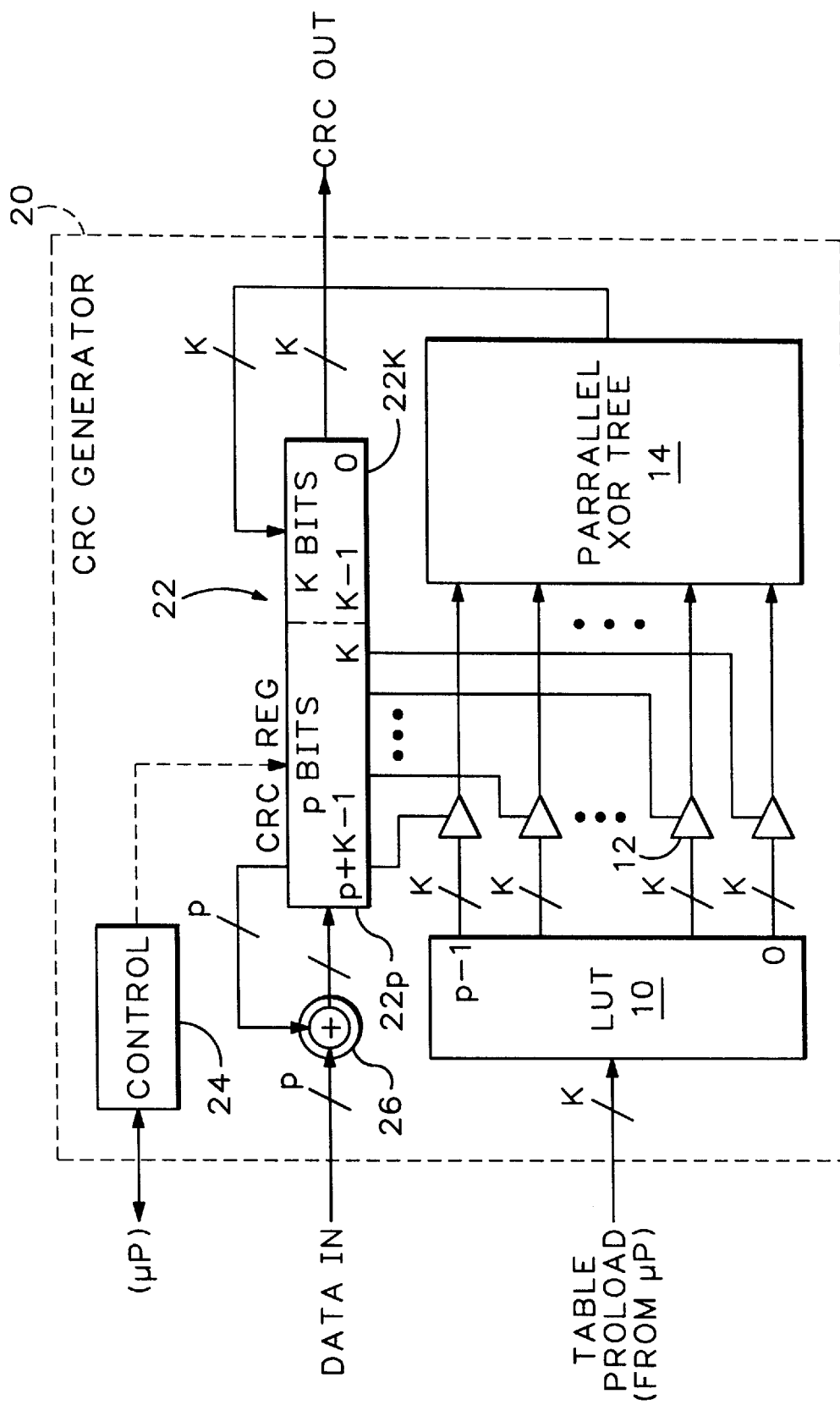
FIG. 2 is a block diagrammatic view of a highly parallel CRC generator according to the present invention, assuming $p \geq k$.

A complete CRC circuit 20 is shown in FIG. 2. A microprocessor (not shown) precomputes the remainders that are loaded into the lookup table 10. A CRC register 22 is divided into two parts, a p-bit portion 22P and a k-bit section 22K. A control circuit 24 controls the CRC register 22, communicates with the microprocessor, and provides appropriate timing signals. An input XOR gate 26 processes a data message p bits at a time. The other inputs to the input XOR gate 26 are the p most significant bits k through p+k−1 from the p-bit portion 22P. The output of the input XOR gate 26 writes the output back into the p-bit portion 22P. The p-bit portion 22P also is applied bit by bit in parallel as a control signal to respective output gates 12 to determine which remainders from the lookup table 10 are input to the parallel XOR tree circuit 14. The k-bit output from the parallel XOR tree circuit 14 is loaded into the least significant bits 0 through k−1 of the k-bit portion 22K. The output from the k-bit portion 22K is the partial CRC.

When applying this hardware to generate 8-bit CRCs over the first four bytes of an Asynchronous Transfer Mode (ATM) header, only one pass is sufficient to generate the final CRC. This offers tremendous time saving over existing CRC algorithms, for it would take them four passes, one-byte partial CRC per pass, for generating the final CRC since the generator polynomial is of degree 8 in this case.

In addition to its inherently high parallelism the present invention is greatly universal, in that it is applicable to any value of n, p and k as well as any generator polynomial. Corresponding to each generator polynomial a different set of pre-computed $R_g[x^i]$s is used. Because for each generator polynomial only k×p bits are needed for storing its corresponding $R_g[x^i]$ set, a small amount of memory suffices to house $R_g[x^i]$ sets for all commonly used generator polynomials. Thus a general purpose CRC processor may be built around the suggested parallel XOR tree architecture. The value of k varies with g(x), but the value of p is fixed in a hardware XOR tree.

CRC calculation of many protocol headers fall into the special case where n=p. In this case only the finish-up portion of the above pseudo code is executed since n=m=p. The pseudo code may be simplified by using a k-bit CRC register and performing the single line operation as follows:

XOR $u_i*R_g[x^{i+k}]$, for $0 \leq i \leq n-1$, and save the result in CRC[k−1 . . . 0].

This is the operation to be used for the ATM cell header error correction (HEC). With such a one-pass CRC syndrome generation capability this invention offers very high-speed protocol header processing.

When n is a multiple of p eventually m equals p. In this case the CRC register needs to support only p-bit shift. A register with hardwired fixed-length shift offers significant improvement in speed over linear shift registers. Most protocol data unit (PDU) definitions fall into this category for they are 64- or 32-bit aligned. The ATM cell payload which has a fixed length of 48-bytes also belongs to this category. Using a 64-bit version of this invention the CRC for a cell payload is computed in six passes.

Another nice feature of this invention is that the length of a message is not required to start the CRC computation. As seen from the pseudo code the finish-up part of the code adjusts properly the partial CRC for final CRC computation. It is thus possible to generate a partial CRC with a partially available message. This is useful in computing CRC over compressed, variable-bit-rate video, since the compressed video may be generated on the fly and the user may not have control over when and where a video frame or field terminates. Splitting the message polynomial u(x) into two disjoint polynomials, u'(x) and u"(x), from the basic properties of binary polynomials the following is true:

$$R_g[x^k u(x)] = R_g[x^k u'(x)] + R_g[x^k u''(x)]$$

This equation has different interpretations depending upon the selection of u'(x) and u"(x). If u'(x) is a fixed-length but originally unknown portion of the message and u"(x) is the rest of the message, $R_g[x^k u''(x)]$ may be computed first and added to $R_g[x^k u'(x)]$ when available to generate the final CRC. This is the case in an IP router where the packet payload is available but the destination IP address is yet to be resolved, or in a multiprotocol environment where the data payload is fixed but the packet header is updated due to protocol conversion, even though different protocols make use of the same generator polynomial.

When u'(x) represents the odd words and u"(x) the even words of u(x), two 32-bit CRC circuits may be incorporated for CRC computation for a 64-bit data path. In order to support this concurrent operation the p value in the pseudo code is replaced by 2p and $R_g[x^i]$ is pre-computed for $k \leq i \leq k+2p-1$. The finish-up portion of the pseudo code is properly modified so as to combine the partial CRC of the two CRC circuits for generating the final CRC. Similarly four 16-bit CRC circuits may be used for the 64-bit path. The advantage of using duplicate CRC circuits is to leverage existing CRC parts for high-speed CRC computation. By employing enough CRC circuits in parallel or pipelining or both, the CRC may be computed as fast as the data can be moved. There is however a short latency spent for CRC computation start-up and finish-up.

Another extension of the present invention is that when a small part of the message is intentionally altered, the CRC may be updated without full-blown recomputation. According to the properties of binary polynomials:

$$\begin{aligned} R_g[x^k u'(x) + x^k u''(x)] &= R_g[x^k u'(x) + x^k c(x) + x^k c(x) + x^k u''(x)] \\ &= R_g[x^k u'(x) + x^k c(x)] + R_g[x^k c(x) + x^k u''(x)]. \end{aligned}$$

Rearranging produces:

$$R_g[x^k c(x) + x^k u''(x)] = R_g[x^k u'(x) + x^k u''(x)] + R_g[x^k u'(x) + x^k c(x)]$$

where u'(x) is the section of the message to be replaced, u"(x) is the rest of the message, and c(x) is the new test to replace u'(x). The above equation indicates that the CRC of the new message, c(x)+u"(x), may be obtained by adding the existing CRC with $R_g[x^k u'(x) + x^k c(x)]$. This is useful where a packet header has to be modified from hop to hop, or in the situation of multiprotocol conversion in which only the fixed size header and/or tail of a message is updated and the body of the data payload is left unaltered. If the length of the packet is foreknown or fixed, the $R_g[x^i]$ set that corresponds to u'(x) may be pre-computed. The generation of $R_g[x^k u'(x) + x^k c(x)]$ is achieved by simply XOR-ing the corresponding $R_g[x^i]$ terms according to the sum of u'(x) and c(x).

CRC specifications usually involve extra one's complement operations, and the present invention is applicable in those cases also. As an example using the ANSI CRC-32 specification employed by the IEEE 802-series networks, including Ethernet, FDDI, token ring and token bus, the CRC-32 generator polynomial is:

$$g(x) = x^{32} + x^{26} + x^{23} + x^{22} + x^{16} + x^{12} + x^{11} + x^{10} + x^8 + x^7 + x^5 + x^4 + x^2 + x + 1$$

The CRC-32 specification may be written as:

$$R_g[x^n z(x) + x^{32} u(x)] + z(x)$$

where $z(x) = x^{31} + x^{30} + \ldots + x + 1$. Since n is the size of the message polynomial, adding $x^n z(x)$ to $x^{32} u(x)$ has the effect of inverting the first 32-bit of u(x), whereas adding z(x) yields the one's complement of $R_g[x^n z(x) + x^{32} u(x)]$. From this the CRC-32 for u(x)=u'(x)+u"(x) may be derived as:

$$\begin{aligned} R_g[x^n z(x) &+ x^{32} u'(x) + x^{32} u''(x)] + z(x) = \\ R_g[x^n z(x) &+ x^{32} u'(x) + x^{32} c(x) + x^{32} c(x) + x^{32} u''(x)] + z(x) = \\ R_g[x^{32} u'(x) &+ x^{32} c(x)] + \{R_g[x^n z(x) + x^{32} c(x) + x^{32} u''(x)] + z(x)\}. \end{aligned}$$

Rearranging produces:

$$R_g[x^n z(x) + x^{32} c(x) + x^{32} u''(x)] + z(x) = \{R_g[x^n z(x) + x^{32} u'(x) + x^{32} u''(x)] + z(x)\} + R_g[x^{32} u'(x) + x^{32} c(x)]$$

Thus immaterial to the extra operations of $x^n z(x)$ and z(x), the CRC-32 syndrome for the new message c(x)+u"(x) is obtained by adding the existing CRC with $R_g[x^{32} u'(x) + x^{32} c(x)]$.

The alteration of the message above is performed bit by bit. However there are instances where bits are inserted or deleted, thus yielding expansion or shrinkage of the message size. It is possible to expand the header and/or tail of a message according to the present invention without recomputing the CRC over the message body. Expanding the header is mathematically equivalent of adding new high-order coefficients to the message polynomial, and thus only the remainders corresponding to these new coefficients need to be added to the existing result for generating the final CRC. Adding new bits at the tail of a message is similar to the processing of the tail of a message whose size is unknown up front. The header or tail expansion property of the present invention is useful in appending digital signature to a CRC-protected message or concatenating two CRC-protected messages into a single one. In the latter case the CRC of u(x) concatenated with v(x) is:

$$R_g[x^k \{x^q R_g[u(x)] + R_g[v(x)]\}] = R_g[x^q R_g[x^k u(x)] + R_g[x^k v(x)]] = R_g[x^q R_g[x^k u(x)]] + R_g[x^k v(x)]$$

where q is the size of v(x). Pre-computing $R_g[x^i]$ for $q \leq i \leq q+k-1$ and storing $R_g[x^k u(x)]$ in the k-bit CRC register, the last equation indicates the final CRC of the concatenated message is the XOR-ing of $R_g[x^k v(X)]$ and $CRC[i] * R_g[x^{q+i}]$, $0 \leq i \leq k-1$. This is obtained by the parallel XOR tree 14 in a single pass, given that the proper $R_g[x^i]$ terms are pre-computed. Since in practice it is not possible to store every possible $R_g[x^i]$, we may selectively store a number of $R_g[x^i]$ sets where each set has p $R_g[x^i]$ terms and the leading $x^i$ terms of these sets are separated by the power of $x^{2p}$, $x^{4p}$, $x^{8p}$, and so on. The purpose is to trade off some memory space for facilitating CRC computation of concatenated messages.

Thus the present invention provides a method and apparatus for highly parallel CRC computations that inherently has a high degree of parallelism in hardware to provide realtime calculations in the very high speed digital data era.

What is claimed is:

1. A highly parallel cyclic redundancy code generator comprising:

means for storing p predetermined remainder polynomials of k bits each, where p is the number of bits to be processed in parallel and k is the degree of the polynomial;

a register having a p-bit portion and a k-bit portion, the k-bit portion providing an output partial cyclic redundancy code;

means for combining the contents of the p-bit portion with an input data message for storage in the p-bit portion; and means for parallel XORing the remainder polynomials from the storing means according to the contents of the p-bit portion to produce the output partial cyclic redundancy code for storage in the k-bit portion.

2. The highly parallel cyclic redundancy code generator as recited in claim 1 wherein the storing means comprises a lookup table having the p predetermined remainder polynomials loaded therein to provide p parallel outputs for input to the parallel XORing means.

3. The highly parallel cyclic redundancy code generator as recited in claim 1 wherein the combining means comprises an XOR circuit having p bits in parallel of the input data message as one input and the p bits from the p-bit portion as a second input, the output of the XOR circuit being coupled to store the result of the XOR operation into the p-bit portion.

4. The highly parallel cyclic redundancy code generator as recited in claim 1 wherein the parallel XORing means comprises:

p gates coupled one to each output of the storing means to receive the p predetermined remainder polynomials in parallel, each p gate being controlled by a respective bit of the p-bit portion; and a parallel XOR tree having the outputs from the p gates as inputs to XOR in parallel those outputs passed by the p-bit portion, and having an output coupled to the k-bit portion for storing the results of the parallel XOR operation as the output partial cyclic redundancy code.

5. A method of generating a highly parallel cyclic redundancy code comprising the steps of:

initially storing p predetermined k-bit remainder polynomials in a lookup table, where p is the number of bits to be processed in parallel and k is the degree of the polynomial;

initially setting a cyclic redundancy code register, having a p-bit portion and a k-bit portion, to zero;

shifting the contents of the cyclic redundancy code register to the left;

XORing the contents of the p-bit portion with an input data message for storage in the p-bit portion;

parallel XORing the p k-bit remainder polynomials according to the contents of the p-bit portion to generate an output k-bit partial cyclic redundancy code for storage in the k-bit portion; and repeating the shifting, XORing and parallel XORing steps until all of the bits of the input data message have been processed, the resulting contents of the k-bit portion being the cyclic redundancy code for the input data message.

* * * * *

UNITED STATES PATENT AND TRADEMARK OFFICE
CERTIFICATE OF CORRECTION

PATENT NO : 5,878,057
DATED : March 2, 1999
INVENTOR(S) : Chia-Yiu-Maa It is certified that error appears in the above-identified patent and that said Letters Patent are hereby corrected as shown below:

Column 1, after line 3 insert the following:

"STATEMENT REGARDING FEDERALLY SPONSORED RESEARCH OR DEVELOPMENT

This invention was made with Government support under Agreement No. N00014-94-C-2168 awarded by Department of Navy. The Government has certain rights in the invention."

Signed and Sealed this

Third Day of April, 2001

*Attest:*

NICHOLAS P. GODICI

*Attesting Officer*  Acting Director of the United States Patent and Trademark Office